United States Patent
Jiles et al.

(10) Patent No.: US 6,664,864 B2
(45) Date of Patent: Dec. 16, 2003

(54) CAVITY DESIGN PRINTED CIRCUIT BOARD FOR A TEMPERATURE COMPENSATED CRYSTAL OSCILLATOR AND A TEMPERATURE COMPENSATED CRYSTAL OSCILLATOR EMPLOYING THE SAME

(75) Inventors: Mekell Jiles, South Holland, IL (US); Vladimir Telemaque, Bartlett, IL (US); Eileen Bartley, Kildeer, IL (US)

(73) Assignee: CTS Corporation, Elkhart, IN (US)

( * ) Notice: Subject to any disclaimer, the term of this patent is extended or adjusted under 35 U.S.C. 154(b) by 106 days.

(21) Appl. No.: 10/004,276

(22) Filed: Oct. 31, 2001

(65) Prior Publication Data

US 2003/0080819 A1 May 1, 2003

(51) Int. Cl.[7] ................................................. H03L 1/00
(52) U.S. Cl. ........................... 331/176; 331/68; 310/348
(58) Field of Search .............................. 331/68, 69, 44, 331/116 R, 116 FE, 158, 108 D, 176; 310/311, 348, 315; 361/752, 753, 757, 820, 728, 746, 747

(56) References Cited

U.S. PATENT DOCUMENTS

| | | | |
|---|---|---|---|
| 4,750,246 A | * | 6/1988 | Pollard ....................... 29/25.35 |
| 5,405,476 A | | 4/1995 | Knecht |
| 5,446,954 A | | 9/1995 | Knecht et al. |
| 6,229,249 B1 | * | 5/2001 | Hatanaka et al. ........... 310/348 |
| 6,229,404 B1 | | 5/2001 | Hatanaka |
| 6,239,669 B1 | | 5/2001 | Koriyama et al. |
| 6,304,151 B1 | | 10/2001 | Uehara et al. |
| 6,456,168 B1 | * | 9/2002 | Luff ............................. 331/68 |

FOREIGN PATENT DOCUMENTS

| | | |
|---|---|---|
| EP | 0 724 334 B1 | 3/1999 |
| JP | 54-118993 | 12/1982 |
| JP | 57-200370 | 12/1982 |

* cited by examiner

Primary Examiner—Henry Choe
(74) Attorney, Agent, or Firm—Steven Weseman; Albert Watkins; Mark Borgman (57) ABSTRACT

A frequency controlled oscillator (100) is manufactured using an array (200) of mechanically interconnected oscillator bases (110) having component cavities (130) and wiring patterns therein. A frequency control component (120) serves as a cover for a cavity within the array, and in addition is electrically connected to oscillator components (140, 150) mounted within the cavity to regulate the frequency of electrical oscillation. Both the oscillator bases and finished oscillators may be tested while still in the array, prior to being separated from each other. In a most preferred embodiment, the array of oscillator bases are manufactured from a polymeric sheet material laminated with electrically conductive traces. The polymeric sheet material is selectively punched or formed prior to lamination so that intermediate and upper layers (112, 113) have predetermined sections removed. These removed sections will align with adjacent layers to form the component cavity from intermediate the top and bottom to the top of the finished laminate.

42 Claims, 12 Drawing Sheets

CAVITY DESIGN PRINTED CIRCUIT BOARD FOR A TEMPERATURE COMPENSATED CRYSTAL OSCILLATOR AND A TEMPERATURE COMPENSATED CRYSTAL OSCILLATOR EMPLOYING THE SAME

TECHNICAL FIELD

This invention pertains generally to crystal regulated oscillators, and more specifically to crystal oscillator packaging.

BACKGROUND

Quartz crystal based oscillators are used for generating frequency reference signals in radio telephones and pagers. The reference oscillator signal is typically used by other frequency synthesizers within the mobile radio device with phase locking.

Quartz crystal resonators offer several comparative advantages; they are inert, relatively power efficient, frequency stable and size scalable. However advantageous, crystal resonators present some practical problems. When quartz crystal is manufactured in an economical manner, its resonant frequencies cannot be predicted (or controlled) with an accuracy sufficient for many applications. Furthermore, the oscillating frequency of known quartz crystals is temperature dependant—the sensitivity varying according to crystal cut and crystal quality generally.

Accordingly, crystal oscillator circuits are both factory tuned to account for manufacturing variances and also equipped with features for temperature compensation. In the basic circuit design, an inverter and biasing resistor are each connected in parallel with the crystal resonator. The inverter and biasing resistor serve to start and then maintain the oscillation. An adjustable capacitance element such as a varactor is connected to the quartz crystal to allow frequency adjustment for factory tuning and temperature compensation. A voltage responsive temperature-sensing element is scaled and operably connected to the adjustable capacitance element to provide temperature compensation of the oscillator frequency. This frequency adjustment is conventionally called "warping" or "pulling."

Radio handsets, pagers and related mobile communicating devices are produced in automated factories in mass volumes. The associated market favors smaller designs and consumer-level pricing. Towards these objectives rigorous attention is applied to electronic component costs and sizes. Therefore, cost and size constraints are important factors in crystal oscillator design.

Because even dust-sized contamination of crystal resonators affects crystal resonance frequencies, packaging and handling for crystal oscillator components is critical. Higher quality crystal based oscillators are assembled in clean room environments, where the crystal resonator is set in a sealed chamber of the overall oscillator package. Inert, dust-free atmospheres are created in the sealed crystal resonator chamber. These special packaging and handling requirements not only contribute to the cost of manufacturing oscillator components but also limit efforts at reducing the overall package size.

There remains a need for lower cost crystal oscillator manufacturing methods and resulting component.

SUMMARY

The invention is a crystal-controlled oscillator packaging system. The oscillator has a crystal resonator, and a housing enclosing the resonator. Electrical connectors extend from the crystal resonator through the housing. A wiring substrate has a cavity enclosed by the crystal resonator housing. Electrical oscillator components located within the cavity are electrically coupled to the crystal resonator electrical connectors and form a frequency controlled oscillator circuit therewith. Electrical terminations couple the frequency controlled oscillator circuit with an external electrical circuit.

Another aspect of the invention is a printed wiring board supporting at least one oscillator component. The wiring board has an electrically insulating base layer, and also has an electrically insulating top layer with an opening (or aperture). The oscillator component is supported upon the base and is accessible through the top layer aperture. Electrical wiring electrically couples the oscillator component to the top layer, and resonator package electrical coupling and mounting pads formed on the top layer are capable of operatively electrically connecting a resonator package to the oscillator component.

A preferred embodiment of the invention includes an array of at least two frequency controlled oscillators that is tested as a single unit. A circuit board electrically connects the array of frequency controlled oscillators to a test connector that is operative to couple to a testing computer. Individual ones of the frequency controlled oscillators each have: a cavity within the multi-layer circuit board; a component mounting pad located within the cavity between circuit board top and bottom; a frequency control component adjacent the cavity and forming an enclosure therewith; and an electronic oscillator component with the enclosure.

The invention also includes a printed circuit oscillator wiring array for use in the production of frequency controlled oscillators. A circuit board has electrical connections for connecting an array of at least two frequency controlled oscillators to a test connector that is operative to couple to a testing computer. Individual oscillator wiring circuits within the printed circuit oscillator wiring array each have a cavity within the circuit board; a component mounting pad located within the cavity between circuit board top and bottom; and an electronic oscillator component mounted adjacent the component mounting pad.

In a method aspect of the present invention a multi-layer wiring board substrate is formed with a plurality of cavities. A base-layer wiring substrate having a top and a bottom surface is provided and patterned with electrically conductive traces. A cavity-layer substrate is provided having a plurality of openings defined therein. The cavity-layer substrate is also patterned with electrically conductive traces. The conductive traces include test connectors on the cavity-substrate. The cavity-layer substrate and the base-layer substrate are laminated together to form a laminated, electrically interconnected wiring substrate such that the cavity-layer and the base-layer together define a plurality of cavities. The cavities of the laminated, electrically interconnected wiring substrate are populated with electronic components. A plurality of packaged frequency control components is provided and used to enclose the cavities to produce a plurality of crystal regulated oscillators. The plurality of crystal regulated oscillators is singulated from a balance of the laminated substrate.

There are other advantages and features of this invention which will be more readily apparent from the following detailed description of the preferred embodiment of the invention, the drawings, and the appended claims.

BRIEF DESCRIPTION OF THE FIGURES

In the accompanying drawings that form part of the specification, and in which like numerals are employed to designate like parts throughout the same.

DETAILED DESCRIPTION OF PREFERRED EMBODIMENTS

While this invention is susceptible to embodiment in many different forms, this specification and the accompanying drawings disclose only preferred forms as examples of the invention. The invention is not intended to be limited to the embodiments so described, however. The scope of the invention is identified in the appended claims.

Figure 1:
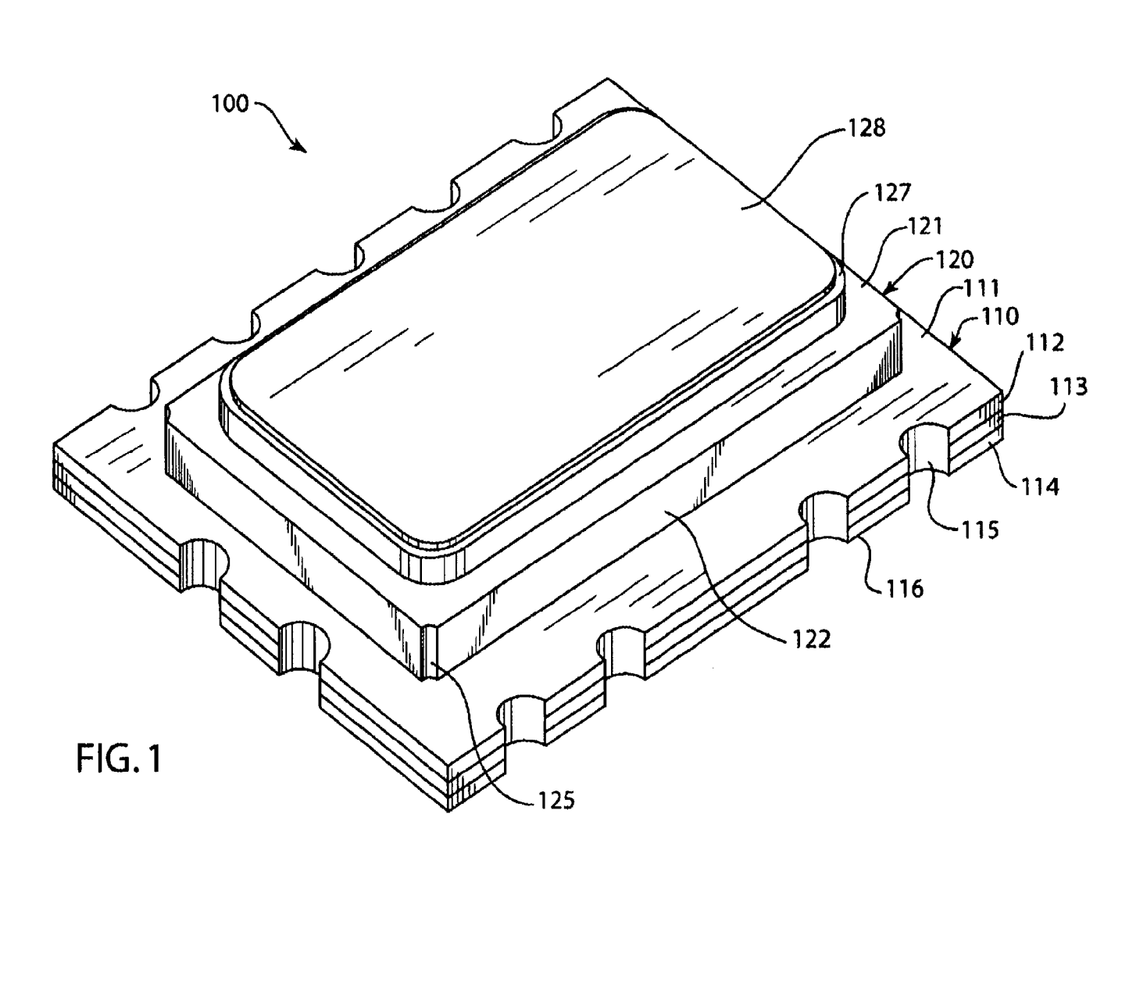
FIG. 1 illustrates a preferred embodiment crystal regulated oscillator from a projected plan view.

A preferred compact frequency controlled oscillator 100 according to the present invention is illustrated in FIG. 1. Oscillator 100 includes a wiring substrate 110, which, in a preferred embodiment, is a multi-layer printed circuit board having electrically conductive wiring laminated between the various polymeric layers 112, 113 and 114. Three polymeric core layers supporting six wiring pattern layers are preferred.

Substrate 110 also includes interlayer wiring on a pair of major, generally planar surfaces which include top 111 and a bottom 116 as well as interlayer wiring. A plurality of castellations 115 are each coated with an electrically conductive material to form electrical interconnections from bottom 116 to top 111 and to selected circuit traces therebetween. Castellations 115 are preferably formed from through-holes or vias punched into each of the layers forming laminated packaging substrate 110. Castellations 115 also aid alignment and placement of individual oscillators 100 in automated parts handling machines. The through-holes are then plated or coated with an electrically conductive material after lamination. Castellations 115 additionally provide selected connection to embedded, interlayer wiring. Internal conductive through-holes are also provided in wiring substrate 110 as discussed further hereinbelow.

A packaged crystal resonator 120 is mounted onto top 111 and electrically and preferably mechanically interconnected thereto using solder. Crystal resonator 120 is conventionally labeled a reference crystal. Packaged resonator 120 includes a resonator base top 121, resonator base side 122, resonator package castellations 125, a sealing ring 127 and a cover 128. The use of a prepackaged hermetically sealed crystal resonator is an important advantage of the present invention.

A suitable packaged crystal resonator is commercially available from Citizen Watch Co., Ltd. (Tokyo, Japan) under the designation CSD-35B.

Conductive epoxy is also contemplated for mounting reference crystal 120 to top 111, although solder is preferred as solder acts to float packaged resonator 120 into relatively precise alignment with top 111. In addition, sealing agents, adhesive glues or potting compounds are optionally applied between resonator subpackage 120 and top 111 to complement the electrical connections to better secure subpackage 120 to top 111 or to better seal cavity 130 (FIG. 2).

Figure 2:
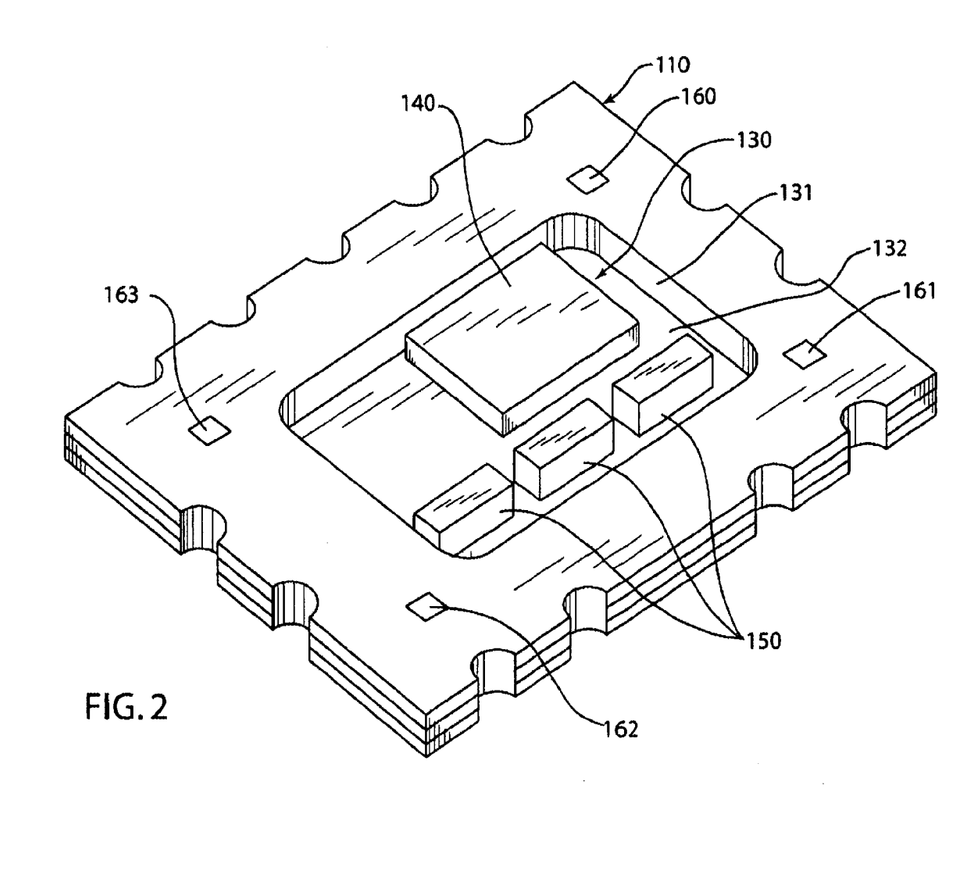
FIG. 2 illustrates the preferred embodiment crystal regulated oscillator of FIG. 1 from a projected plan view with the crystal package removed to reveal the cavity and components therein.

FIG. 2 is an enlarged perspective view of the oscillator of FIG. 1 with the resonator package 120 removed to reveal internal details. As shown, a component cavity 130 contains an Application Specific Integrated Circuit (ASIC) 140 mounted to and electrically connected to circuit traces formed upon cavity surface 132. Additional oscillator cavity-mounted components 150 optionally include capacitors for signal filtering and other active and passive electronic components mounted to circuit traces formed upon cavity surface 132.

When used for temperature compensated crystal oscillators, cavity 130 preferably includes an ASIC designed for temperature compensation together with discrete capacitors for signal filtering. Temperature compensation ASIC 140 includes a feedback subcircuit (e.g. an inverter and biasing resistor) for starting and maintaining oscillation, a frequency adjuster subcircuit to modifying the output frequency, a digital memory for storing temperature compensating correction parameters, and a temperature sensing element. The frequency adjuster subcircuit preferably includes an adjustable capacitance element such as an on-chip varactor for connection to the quartz crystal of resonator subpackage 120.

Four electrically conductive pads 160, 161, 162 and 163 are provided at corners external to cavity 130, which serve as resonator package electrical coupling and mounting pads. Each of these pads will most preferably correspond in physical placement to corresponding electrically conductive pads adjacent resonator castellations 125 on resonator housing 120.

Figure 3:
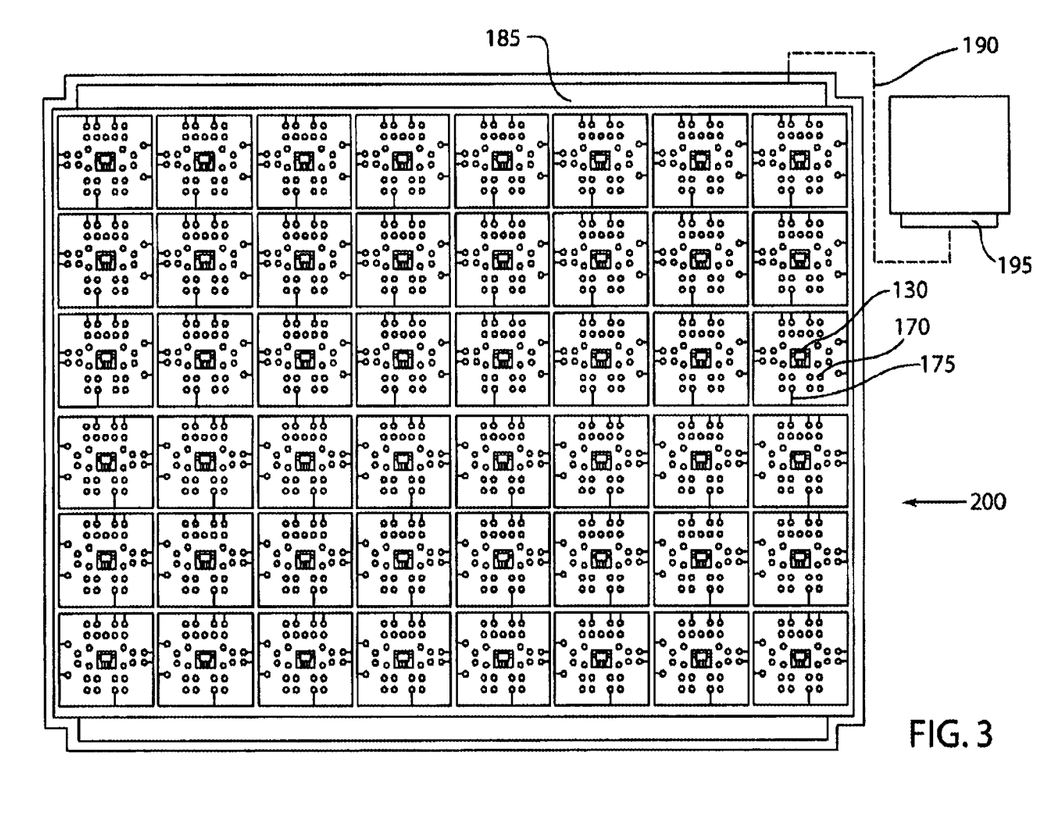
FIG. 3 is a symbolic plan view of the cavity side of a circuit board array used in the fabrication of multiple crystal regulated oscillators shown in FIG. 1.

Referring now to FIG. 3, oscillator 100 is manufactured using an array 200 of mechanically interconnected oscillator bases 110 having component cavities 130 and wiring patterns therein. Each oscillator base is individually linked to test connectors 185 for testing and external communication. Oscillator components such as ASIC 140 and capacitors 150 are placed and electrically connected within cavities 130, and are then preferably potted, transfer molded or encapsulated. After frequency control components 140, 150 are placed and encapsulated, then packaged resonators 120 are applied as mechanical covers for each of the functional cavities within array 200. Packaged resonators 120 are also electrically connected to oscillator components 140, 150 mounted within each cavity 130.

Both oscillator package bases 110 and finished oscillators 100 are testable and available for communication via test connectors 185 while still unsingulated and in array card 200. Testing of and communication with individual bases 110 and assembled oscillators 100 is accomplished using testing computer 195 interconnected through link 190 to connectors 185. Each of substrates 110 illustrated in FIG. 3 are coupled through conductors 175 to connectors 185.

Oscillator package bases 110 (and therefore the source wiring substrate card 200) are preferably prepared from relatively heat-resistant polymeric sheet materials supporting layers of electrically conductive trace patterns. Multiple layers of polymeric sheet materials and conductive trace patterns are laminated together to form a single substrate. Other sheet materials suitable for supporting wiring and lamination are contemplated herein, including various plastic and ceramic molded packages, and packages manufactured or machined from diverse materials including various coated metals and ceramics.

Specifically, both oscillator package bases 110 and finished oscillators 100 are testable and available for communication via test connectors 185 while still unsingulated and in array card 200. This array multi-unit processing allows for more efficient high volume production of oscillators 100 as discussed in further detail below.

Figure 4:
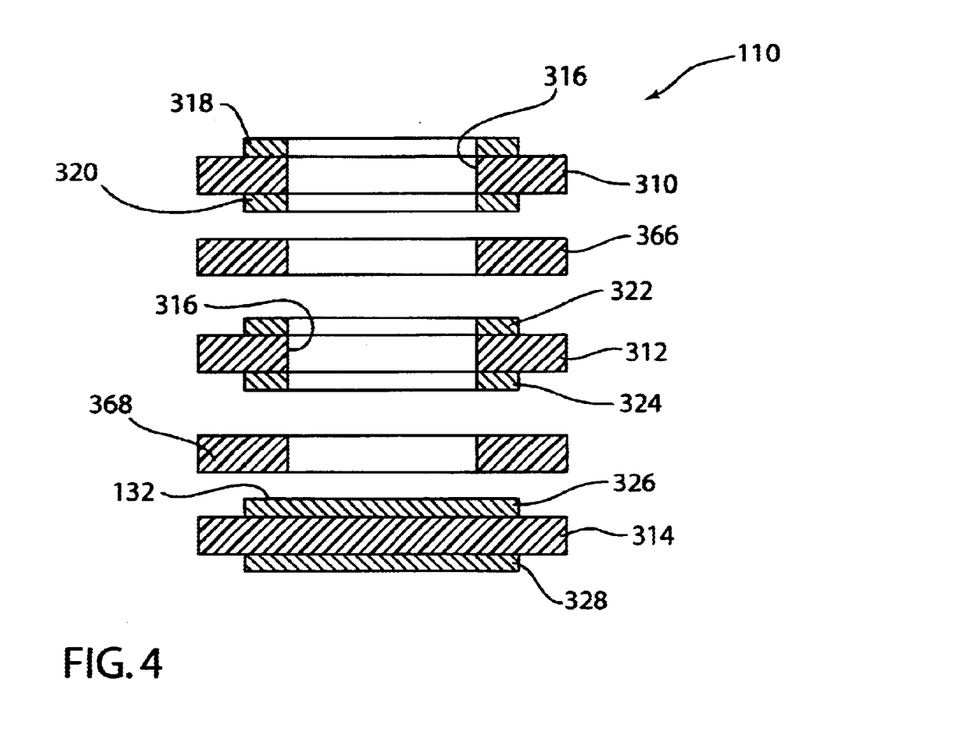
FIG. 4 is an exploded, schematic cross-section illustrating the layers of polymeric material and conductive trace layers forming the laminated wiring substrate of the packaged oscillator shown in FIG. 1.

FIG. 4 is a schematic cross-section showing the laminated layers of packaging substrate 110 (and therefore the overall array card 200). Substrate 100 includes three core polymeric sheet layers 310, 312 and 314. Layers 310 and 312 each include an opening or aperture 316 which serve to form the walls 131 (FIG. 2) of the individual cavities 130. Layers 310 and 312 can therefore be labeled cavity layers. Polymeric layer 314 does not contain an aperture but instead provides the cavity base surface 132.

Figure 5:
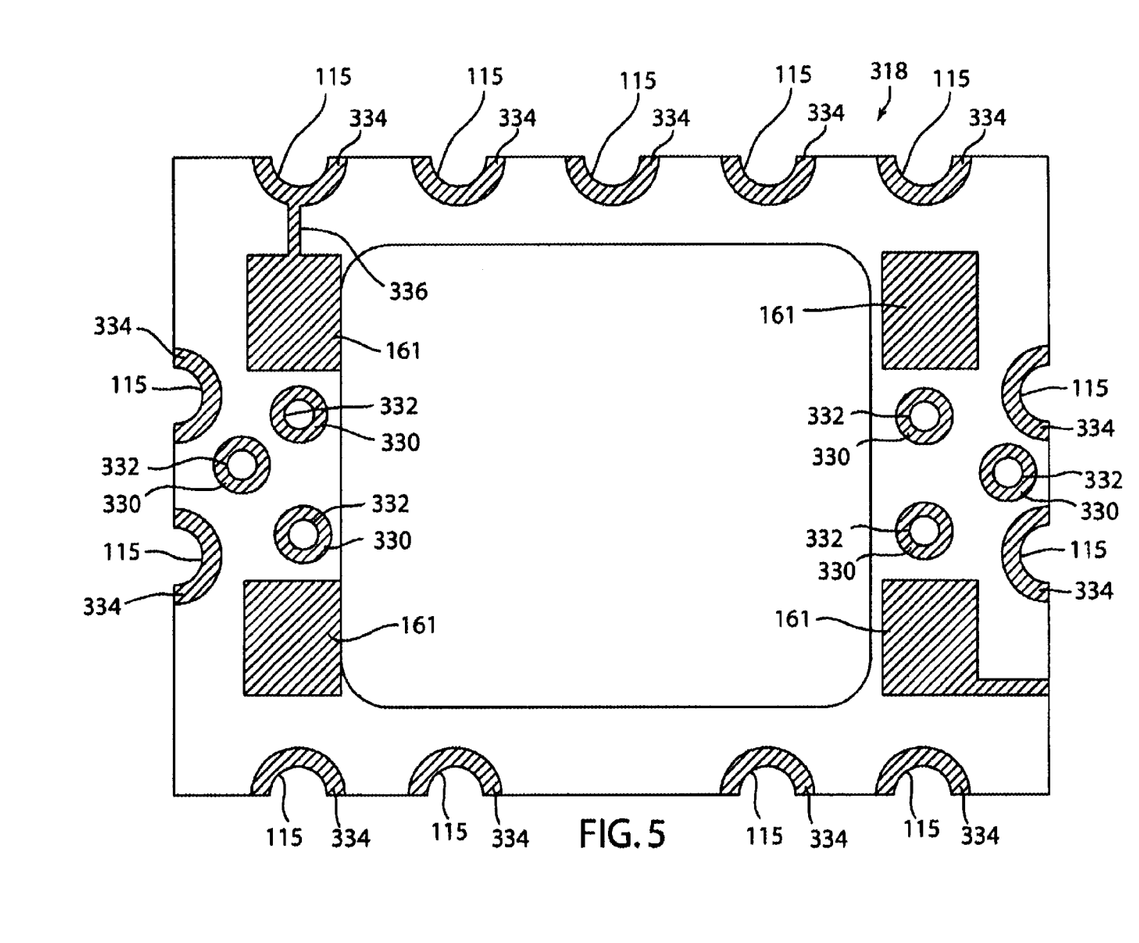
FIG. 5 is a schematic view of the first layer pattern of conductive traces for the oscillator of FIG. 1 illustrating the opening (or aperture) for the component cavity, circuit traces, conductive through-holes and side castellations.
Figure 6:
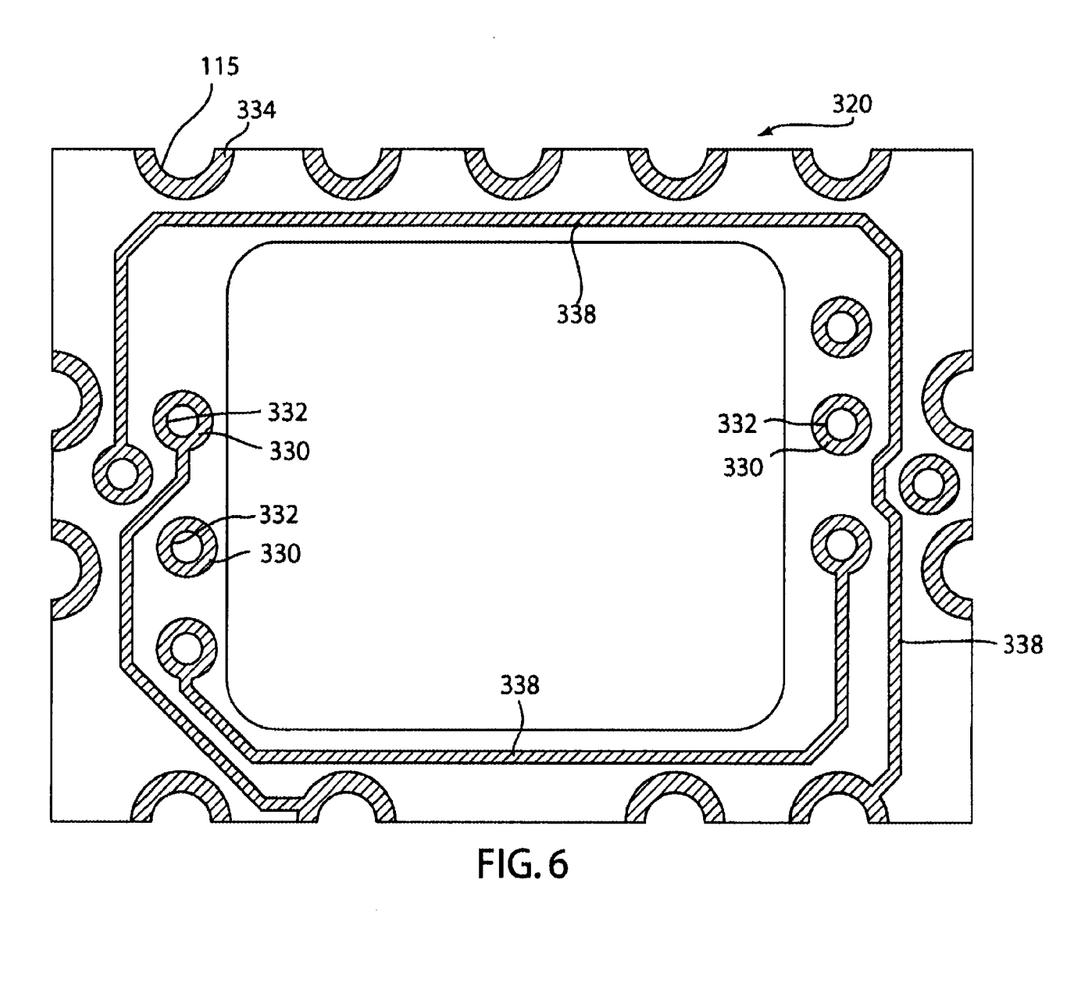
FIG. 6 is a schematic view of the second layer pattern of conductive traces for the oscillator of FIG. 1 illustrating the opening for the component cavity, circuit traces, conductive through-holes and side castellations.

Packaging substrate 110 includes six conductive trace pattern layers 318, 320, 322, 324, 326 and 328, supported on the three polymeric core layers 310, 312 and 314. Polymeric layer 310 supports a top trace pattern 318 which is illustrated in FIG. 5 and a bottom trace pattern 320 which is illustrated in FIG. 6. Referring to FIG. 5, trace pattern layer 318 includes mounting pads 161 for the resonator subpackage 120, through-hole conductive outlines 330 for conductive through-holes 332 and castellation outlines 334 which serve to form conductive side castellations 115 (FIG. 1). A conductive trace 336 connects one of the castellations 115 to one of the mounting pads 161.

FIGS. 5 through 10 are enlarged plan views of conductive trace patterns around a single oscillator package substrate 110. Castellations 115 are fabricated by creating conductive through-holes in array card 200. During manufacturing, the singulation step preferably includes separating individual oscillators at the conductive through-holes such that the remaining half of the conductive through-hole serves as a conductive castellation 115.

Conductive trace layer 320 shown in FIG. 6 includes castellation outlines 334, through-hole outlines 330 and conductive traces 338 linking throug-hole outlines 330 to selected castellations 115. Selected conductive through-holes do not extend through all core polymeric layers.

Figure 7:
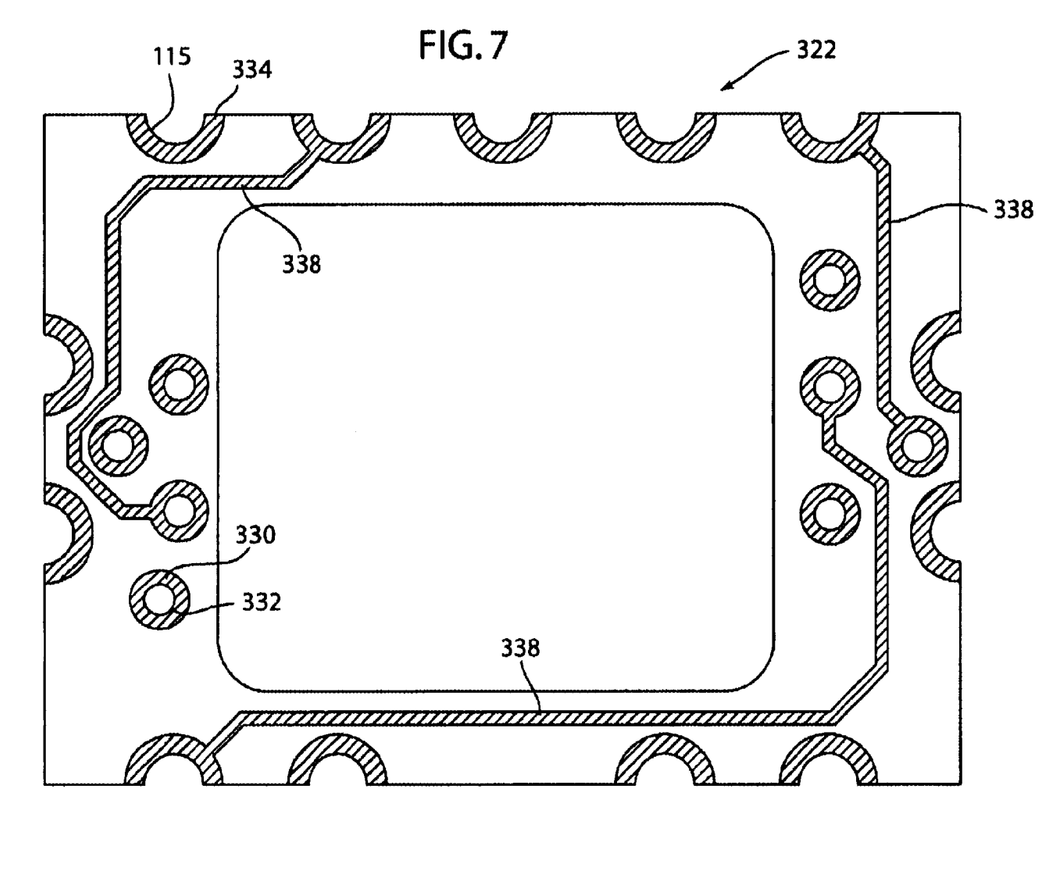
FIG. 7 is a schematic view of the third layer pattern of conductive traces for the oscillator of FIG. 1 illustrating the opening for the component cavity, circuit traces, conductive through-holes and side castellations.
Figure 8:
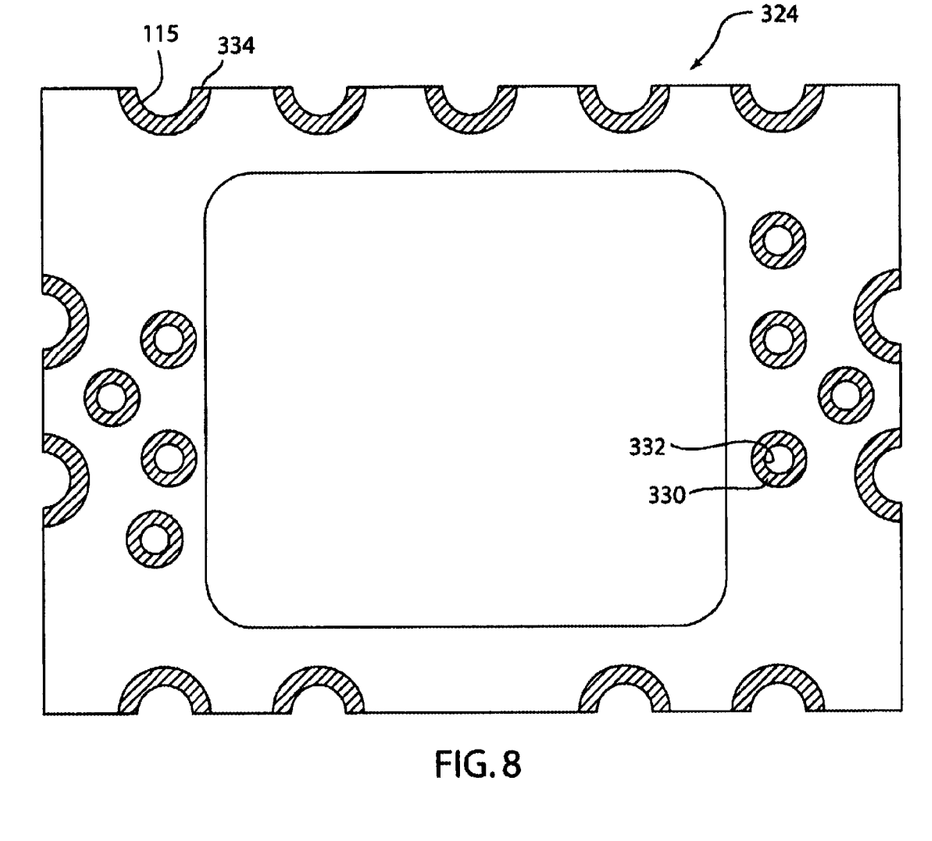
FIG. 8 is a schematic view of the fourth layer pattern of conductive traces for the oscillator of FIG. 1 illustrating the opening for the component cavity, conductive through-holes and side castellations.

Polymeric core layer 312 supports a top conductive trace pattern 322 which is illustrated in FIG. 7 and a bottom conductive trace pattern 324 which is illustrated in FIG. 8. Trace pattern 322 (FIG. 7) includes castellation outlines 334, through-hole outlines 330 for conductive through-holes 332 and conductive traces 338 linking through-hole outlines 330 to selected castellations 115. Conductive trace pattern layer 324 (FIG. 8) includes through-hole outlines 330 and castellation outlines 334.

Figure 9:
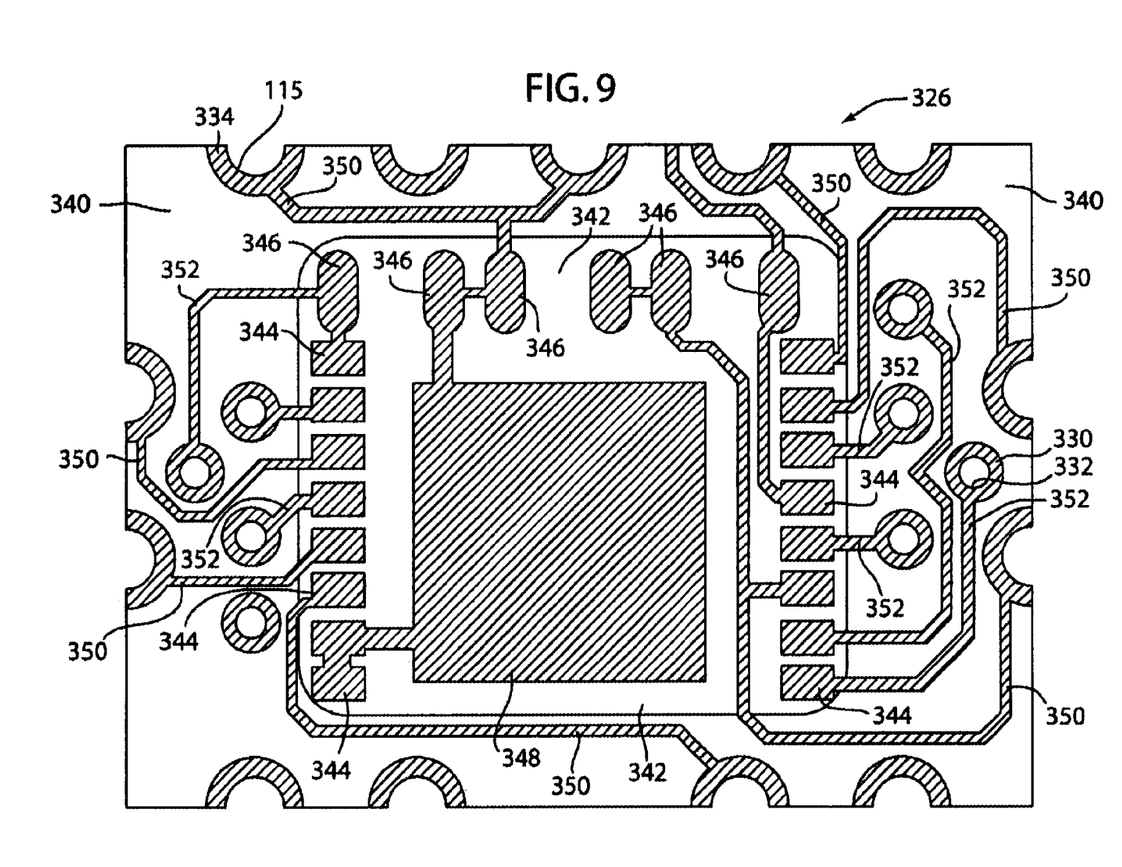
FIG. 9 is a schematic view of the fifth layer pattern of conductive traces for the oscillator of FIG. 1 illustrating the cavity base circuit pattern, the interconnecting circuit traces, conductive through-holes and side castellations.

Base polymeric core layer 314 supports a top conductive trace pattern 326 which is shown in FIG. 9 and opposes trace pattern 324 (FIG. 8). Conductive trace pattern 326 (FIG. 9) is relatively more complex as it includes both an interlayer area 340 and a cavity base area 342 covering cavity base surface 132. In base area 342, pattern 326 includes connection pads 344 for ASIC integrated circuit die 140, connection pads 346 for signal filtering discrete capacitors 150 and a die shield electrode 348. Extending between base area 342 and interlayer area 340 are traces 350 linking selected connection pads to castellation 115 and traces 352 linking selected connection pads to conductive through holes 332.

Figure 10:
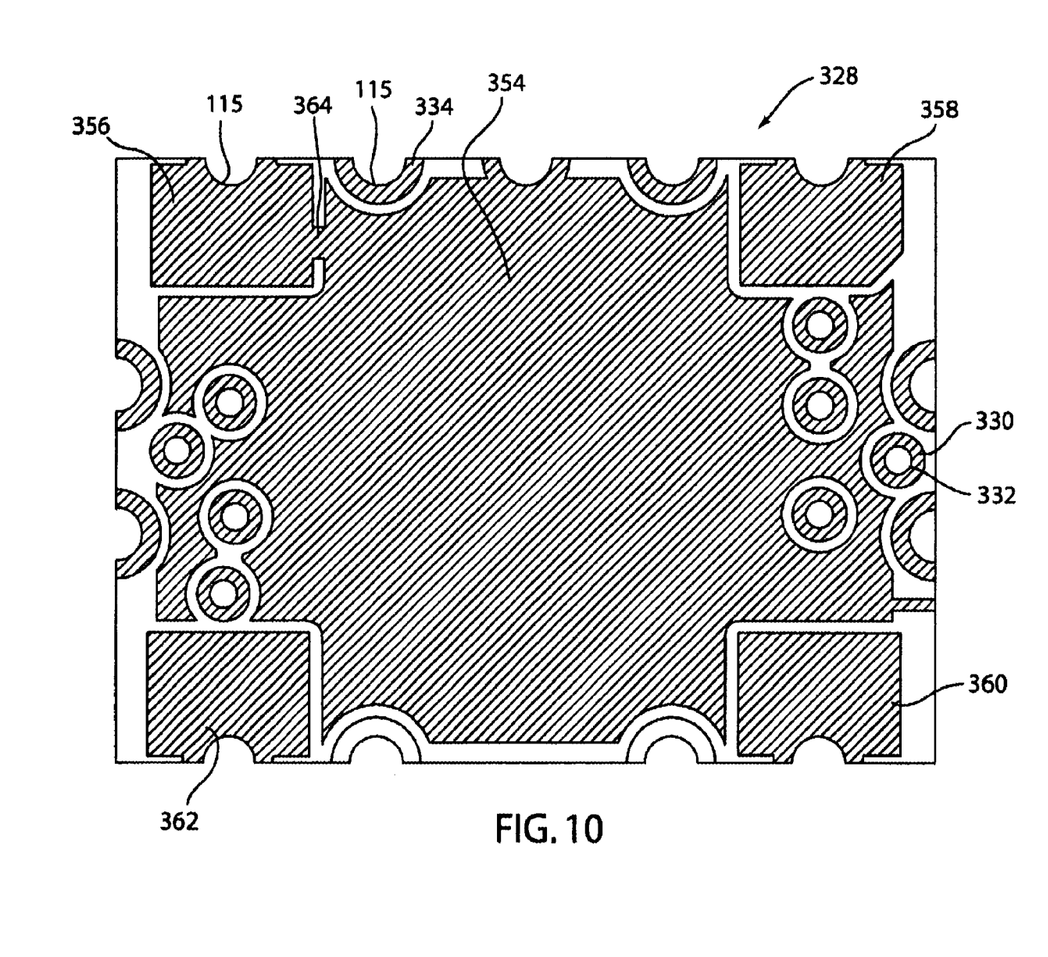
FIG. 10 is a schematic view of the first layer pattern of conductive traces for the oscillator of FIG. 1 illustrating circuit traces, conductive through-holes, an interference shield, side castellations and surface-mount pads.

Shown in FIG. 10 is trace pattern 328 for bottom surface 116 (FIG. 1) of oscillator package 110. Pattern 328 includes a shield electrode 354, castellation outlines 334, through-hole outlines 330 and four surface mounting pads 356, 358, 360 and 362. Pad 356 serves as a ground connection and is linked to shield 354 via a connection trace 364.

Viewed together, the six conductive trace pattern layers 316, 318, 320, 322, 324 and 326 define a relatively high-density three-dimensional wiring scheme inter linking resonator subpackage 120, ASIC 140, capacitors 150, castellations 115 and mounting pads 356, 358, 360 and 362.

Referring again to FIG. 4, polymeric core layers 310, 312 and 314 are bonded together using adhesive layers 366 and 368, which are conventionally called "prepreg" because they are partially cured before lamination. For a discussion of wiring board fabrication methods, including lamination techniques, see, Shaw, Sam R. and Alonzo S. Martinez Jr. *"Rigid And Flexible Printed Wiring Boards And Microvia Technology"* in Harper, Charles A., Ed. *Electronic Packaging And Interconnection Handbook*, 3rd Ed., Chapter 11, McGraw-Hill, New York, N.Y. (2000), the relevant portions of which are herein incorporated by reference.

Figure 11:
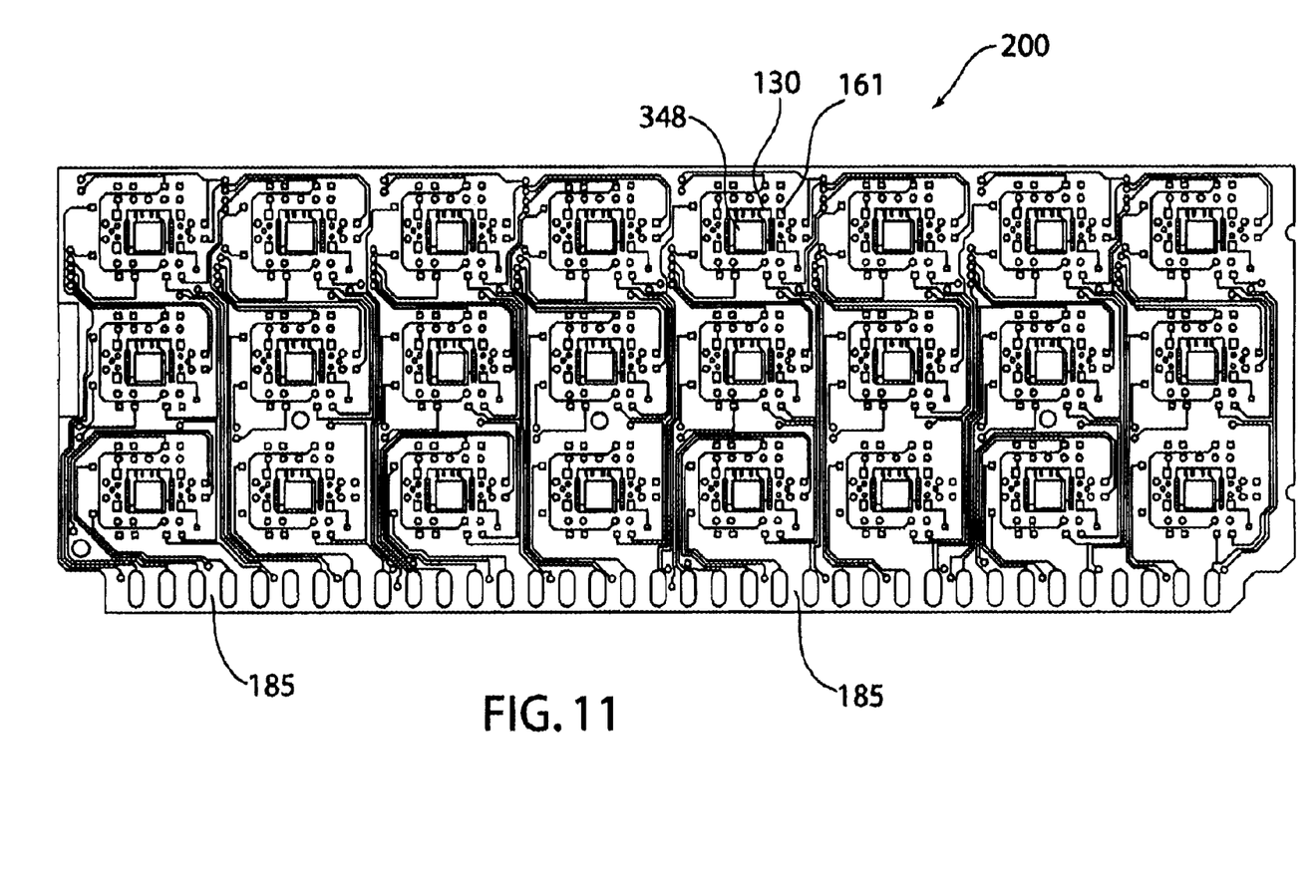
FIG. 11 is an enlarged, expanded cavity-side view of one half of a printed circuit board used in the fabrication of crystal-regulated oscillators according to the present invention.
Figure 12:
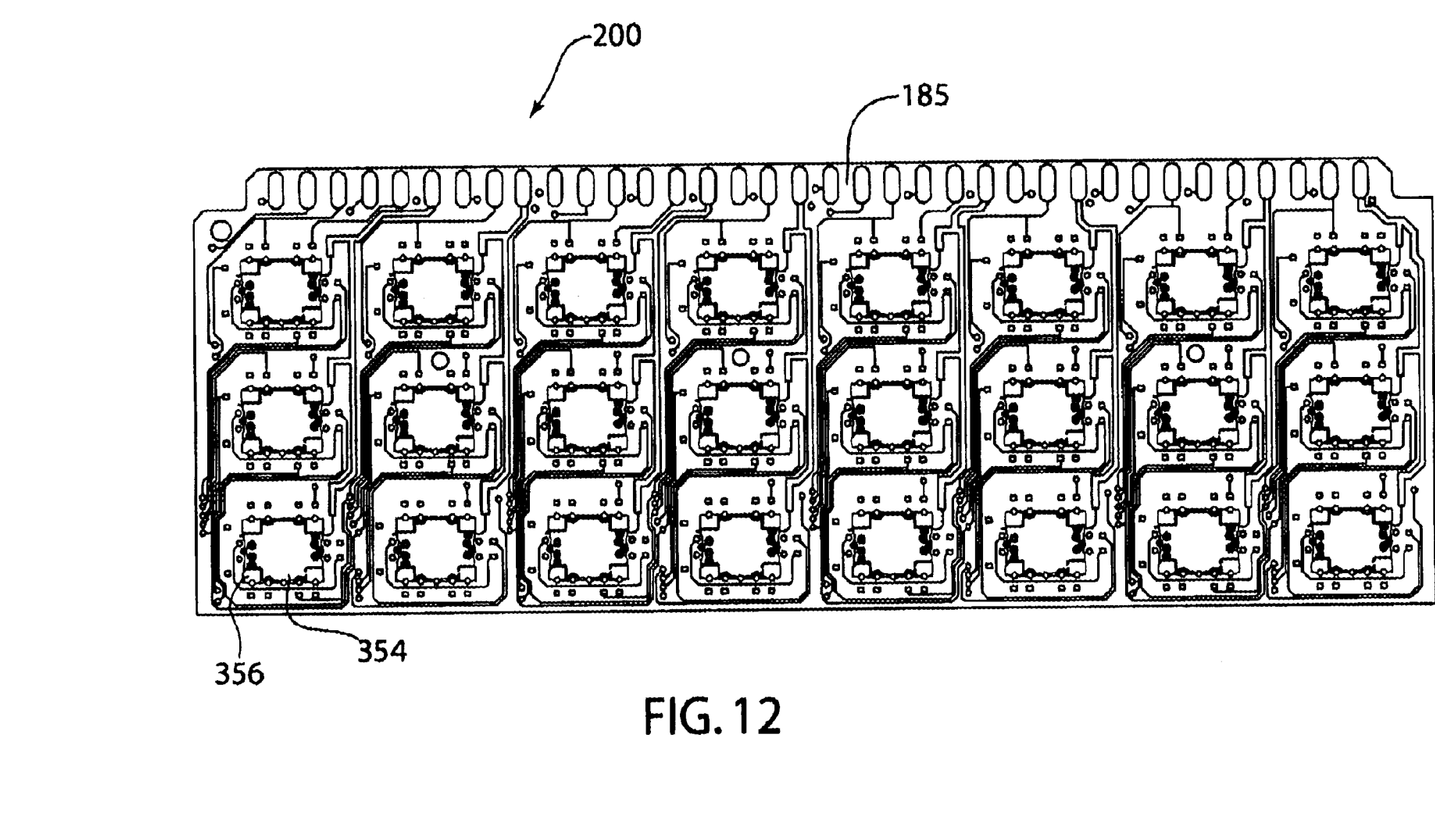
FIG. 12 is an enlarged, expanded bottom-side view of one half of a printed circuit board used in the fabrication of crystal-regulated oscillators according to the present invention.

FIG. 11 is a cavity-side view of one half of a printed circuit board used in the fabrication of crystal-regulated oscillators according to the present invention. The view of FIG. 11 has been enlarged to reveal implementation details. FIG. 12 is likewise an enlarged bottom-side view of the one half of a printed circuit board of FIG. 11.

A method for manufacturing a crystal regulated oscillator includes the steps of providing a base layer wiring substrate having a top and a bottom surface, and patterning electrically conductive traces on the base-layer wiring substrate. For example, conductive traces are added including a plurality of trace patterns 326 and 328 of FIGS. 9 and 10, respectively, on opposing sides of a base-polymeric core layer such as layer 314. The method also includes providing a cavity-layer wiring substrate having a plurality of openings defined therein such as layer 310 or layer 312. Electric traces are patterned on the cavity-layer wiring layer. For example, conductive traces are added including a plurality of trace patterns 318 and 320 of FIGS. 5 and 6, respectively, on opposite sides of the cavity-layer wiring layer.

The manufacturing method includes then laminating together the base-layer wiring substrate and at least one cavity-layer substrate to form a laminated, electrically interconnected wiring substrate. The openings of the cavity-layer substrates together with the base layer define an array of cavities. The resulting laminated wiring substrate card includes test connectors preferably at one or more edges of the card for convenient insertion into a digital communication bus.

The laminated interconnected wiring substrate is optionally, but preferably, tested for interconnections and shorts before adding components by linking connectors (e.g. connectors 185, FIG. 3) to a test computer (e.g. computer 195, FIG. 3). The test computer optionally rejects a complete card of oscillator packages. Alternatively, the test computer records the location of individual defective packages identified on a tested substrate card in internal computer memory for communication to downstream assembly equipment. This package testing step optionally includes making a physical marking on a defective cavity or individual package for optical recognition by downstream automated part assembly equipment.

The most cost effective method of rejecting wiring substrate defects necessarily varies according to factory layout. If laminated wiring cards are fabricated at a factory site different from component assembly, complete acceptance or rejection of a complete multi-package card is preferred.

The completed laminated wiring substrate card containing a plurality of cavities for oscillator packaging is populated with electronic components including an integrated circuit die for providing temperature compensation. The electronic components are mounted into the plurality of cavities. The temperature compensating IC die includes a frequency adjuster subcircuit, a digital memory for storing frequency adjustments and a temperature sensor. The IC digital memory is operably linked to the test connectors for communication with a test computer.

A plurality of packaged frequency control components such as prepackaged reference crystals are provided to enclose the plurality of the cavities resulting in a plurality (or array) of crystal regulated oscillators supported on the laminated wiring substrate card. Each frequency control component is operably linked to the frequency adjuster subcircuit of the IC die.

Frequency adjustment parameters to compensate for manufacturing variance and also crystal resonator temperature changes are determined and stored in each digital memory. Individual crystal regulated oscillators (e.g. 100, FIG. 1) are singulated from a balance of the laminated substrate. Separation or singulation is accomplished using one of a variety of techniques, including sawing, dicing, punching and the like. Regardless of the technique used, it is preferable to divide vias and thereby form castellations as discussed above.

For higher tolerance oscillator applications, the step of determining frequency adjustment parameters may be based on the known, average temperature sensitivity data for the plurality of packaged frequency control components. For improved output stability, however, the step of determining frequency adjustment parameters includes individually operating and adjusting the output frequency of each oscillator to match a fixed high-purity reference signal for different operating temperatures. The test computer records a table (or equation) of required correction parameters needed to match the target, high-purity reference signal for each oscillator. The test computer then stores in the digital memory unit customized frequency correction parameters in each oscillator (e.g. 100, FIG. 1).

The step of determining individual, customized temperature correction parameters for each crystal regulated oscillator as described above is potentially a factory bottleneck. This calibrating step is greatly simplified by the present invention because card-supported groups of crystal regulated oscillators can be conveniently loaded into test equipment using communication buses adapted to receive the card connectors (e.g. 185, FIG. 3).

The fabrication methods and resulting crystal regulated oscillator components of the present invention have several key features. It is an important feature of the present invention that for temperature calibration the individual handling, picking and loading of small individual crystal regulated oscillators into test fixtures can be avoided. The present invention allows a large set of fully assembled oscillator components to be tested for defects and calibrated while still in the form of a conveniently transportable, integrated array card. This multi-unit bus card testing is possible because each oscillator unit is individually addressable via corresponding connectors and wiring board traces.

The use of a prepackaged resonator (or reference crystal) 120 is an important feature of the present invention. Resonator 120 is preferably supplier tested prior to installation onto wiring substrate 110. Such a pretesting of the resonator subpackage limits the scrap costs to the resonator subpackage 120 rather than a fully assembled crystal regulator oscillator. Additionally, resonator 120 includes a hermetically sealed and therefore environmentally isolated quartz or other crystal resonator, as is known in the industry. This separate housing may be produced and/or populated using a very clean manufacturing environment such as a clean room, and may be filled with special gases or vacuum in order to improve the performance characteristics of the finished resonator 120, including aging characteristics.

By forming a resonator separate from oscillator circuitry, the manufacturing techniques applicable to oscillator circuitry, which are typically less stringent, may be used for oscillator components other than resonator 120, consequently reducing manufacturing expenses for assembly of less critical components.

EXAMPLE

An array card of 48 surface mountable temperature compensated crystal oscillators were prepared for output at 16.8 MegaHertz (MHz). A card 200 of six rows by eight columns of oscillator packages had dimensions of 102 millimeters (mm) by 72 millimeters (mm). Each resulting oscillator 100 had a footprint of 7 millimeters (mm) by 5 millimeters (mm). Mounted to each of the 48 individual 5 mm by 7 mm cavity substrates 110 was a prepackaged 16.8 MegaHertz (MHz) reference crystal having dimensions of 3.2 millimeters (mm) by 6 millimeters (mm) by 1 millimeter (mm) commercially available from Citizen Watch. Co., Ltd. under the designation CSD-35B.

Numerous variations and modifications of the embodiments described above may be effected without departing from the spirit and scope of the novel features of the invention. It is to be understood that no limitations with respect to the specific system illustrated herein are intended or should be inferred. It is, of course, intended to cover by the appended claims all such modifications as fall within the scope of the claims.

We claim:

1. A crystal regulated oscillator comprising:
   a crystal resonator;
   a housing enclosing said crystal resonator having a top, sides and a bottom;
   electrical connectors extending from said crystal resonator through said housing;
   a wiring substrate having a top surface, bottom surface, and sides;
   a cavity within said wiring substrate enclosed by said crystal resonator housing;
   electrical oscillator components within said cavity electrically coupled to said crystal resonator electrical connectors and forming a frequency controlled oscillator circuit therewith; and
   electrical terminations for coupling said frequency controlled oscillator circuit with an external electrical circuit.

2. The crystal regulated oscillator of claim 1 wherein said wiring substrate further comprises an electrically non-conductive body with electrically conductive circuit traces.

3. The crystal regulated oscillator of claim 2 wherein said electrically non-conductive body further comprises a laminated polymer.

4. The crystal regulated oscillator of claim 1 wherein said wiring substrate further comprises a board having a generally planar top surface and a generally planar bottom surface, and wherein said cavity is located between said planar top surface and said planar bottom surface.

5. The crystal regulated oscillator of claim 1 wherein said electrical oscillator components include surface mounted components.

6. The crystal regulated oscillator of claim 1 wherein said electrical oscillator components include integrated circuit dies and discrete components.

7. The crystal regulated oscillator of claim 1 wherein said electrical oscillator components are encapsulated within said cavity.

8. The crystal regulated oscillator of claim 7 wherein said electrical oscillator components are potted within said cavity.

9. The crystal regulated oscillator of claim 1 wherein said housing is a hermetic housing.

10. The crystal regulated oscillator of claim 2 further comprising conductive through-holes in said electrically non-conductive body.

11. The crystal regulated oscillator of claim 2 further comprising electrically conductive castellations in said electrically non-conductive body.

12. The crystal regulated oscillator of claim 1 wherein said electrical terminations are electrically interconnected to said castellations.

13. The crystal regulated oscillator of claim 1 wherein said crystal resonator further comprises a quartz resonator.

14. The crystal regulated oscillator of claim 13 wherein said electrical oscillator components further comprise a temperature compensation circuit.

15. A printed wiring board supporting at least one oscillator component, comprising:
   an electrically insulating base layer having first and second major surfaces;
   an electrically insulating top layer having first and second major surfaces an aperture extending through said top layer generally normal to said first and second major surfaces;
   said at least one oscillator component supported upon said first major surface of said base and accessible through said top layer aperture;
   electrical wiring electrically coupling said at least one oscillator component to said top layer first major surface; and
   resonator package electrical coupling and mounting pads formed on said top layer first major surface capable of operatively electrically connecting a resonator package to said at least one oscillator component.

16. The printed wiring board supporting at least one oscillator component of claim 15 further comprising:
   at least one additional electrically insulating layer interposed between said base layer and said top layer and having an aperture therein; and
   electrical wiring interposed between said at least one additional electrically insulating layer and said top layer.

17. The printed wiring board supporting at least one oscillator component of claim 15 wherein said at least one oscillator component is encapsulated within a potting compound.

18. The printed wiring board supporting at least one oscillator component of claim 16 wherein said base, top and at least one additional layers are laminated together.

19. The printed wiring board supporting at least one oscillator component of claim 15 wherein said base and top layers further comprise a polymer.

20. An array of at least two frequency controlled oscillators suitable for automated testing as a single unit:
   a circuit board having a top and a bottom and electrical connections for connecting said array of at least two frequency controlled oscillators to a test connector that is operative to couple to a testing computer, wherein individual ones of said array of at least two frequency controlled oscillators further comprise:
   a cavity within said circuit board;
   a component mounting pad located within said cavity between said circuit board top and said circuit board bottom;
   a frequency control component adjacent said cavity and forming an enclosure therewith; and
   an electronic oscillator component within said enclosure.

21. The array of at least two frequency controlled oscillators of claim 20 wherein said frequency control component includes a quartz resonator.

22. The array of at least two frequency controlled oscillators of claim 20 wherein said electronic oscillator component includes an integrated circuit die providing temperature compensation.

23. The array of at least two frequency controlled oscillators of claim 20 further comprising at least one through hole electrically interconnecting said circuit board top to said circuit board bottom.

24. The array of at least two frequency controlled oscillators of claim 20 wherein said circuit board top and said circuit board bottom have generally planar surfaces.

25. The array of at least two frequency controlled oscillators of claim 20 wherein said circuit board includes 48 individual freqency-controlled oscillators.

26. The array of at least two frequency controlled oscillators of claim 20 wherein said electronic oscillator component further comprises an integrated circuit.

27. A printed circuit oscillator wiring array for use in the production of frequency controlled oscillators, comprising a circuit board having a top and a bottom and electrical connections for connecting an array of at least two frequency controlled oscillators to a test connector that is operative to couple to a testing computer; and wherein individual oscillator wiring circuits within said printed circuit oscillator wiring array further comprise:
- a cavity within said circuit board;
- a component mounting pad located within said cavity between said circuit board top and said circuit board bottom; and
- an electronic oscillator component mounted adjacent said component mounting pad within said cavity.

28. The printed circuit oscillator wiring array for use in the production of frequency controlled oscillators of claim 27 further comprising at least one through hole electrically interconnecting said circuit board top to said circuit board bottom.

29. The printed circuit oscillator wiring array for use in the production of frequency controlled oscillators of claim 27 wherein said circuit board top and said circuit board bottom have generally planar surfaces.

30. The printed circuit oscillator wiring array for use in the production of frequency controlled oscillators of claim 27 wherein said electronic oscillator component further comprises an integrated circuit.

31. A method for manufacturing a crystal regulated oscillator comprising the steps of:
- providing a base layer wiring substrate having a top and a bottom surface;
- patterning electrically conductive traces on said base-layer wiring substrate
- providing a cavity-layer substrate having a plurality of openings defined therein;
- patterning electrically conductive traces including test connectors on said cavity-substrate;
- laminating together said base-layer wiring substrate and said cavity-layer substrate to form a laminated, electrically interconnected wiring substrate, said cavity-layer and said base-layer together defining a plurality of cavities at said plurality of openings;
- populating said cavities with electronic components;
- providing a plurality of packaged frequency control components;
- enclosing said cavities with said frequency control components to produce a plurality of crystal regulated oscillators; and
- singulating said plurality of crystal regulated oscillators from a balance of said laminated substrate.

32. The method for manufacturing a crystal regulated oscillator of claim 31, comprising the additional step of testing said laminated, electrically interconnected substrate using said test connectors to identify functional and defective crystal regulated oscillators after said enclosing step and before said singulating step.

33. The method for manufacturing a crystal regulated oscillator of claim 31 comprising the additional step of testing said laminated, electrically interconnected substrate using said test connectors to identify functional and defective cavities after said laminating step and before said populating step.

34. The method for manufacturing a crystal regulated oscillator of claim 31 wherein each said packaged frequency controlled products is a packaged reference crystal.

35. The method for manufacturing a crystal regulated oscillator of claim 34, comprising the additional step of selecting operative ones of said assembled frequency control components while rejecting defective ones of said assembled frequency control components responsive to said testing of said assembled frequency control components.

36. The method for manufacturing a crystal regulated oscillator of claim 31, comprising the additional steps of:
- electrically evaluating said plurality of crystal regulated oscillators using said test connectors to identify working crystal regulated oscillators and defective crystal regulated oscillators before said singulating step; and
- rejecting defective crystal regulated oscillators responsive to said electrical evaluation step.

37. The method for manufacturing a crystal regulated oscillator of claim 31 wherein said base-layer wiring substrate is made of a polymeric material.

38. The method for manufacturing a crystal regulated oscillator of claim 31 comprising the additional step of curing said laminated substrate.

39. The method for manufacturing a crystal regulated oscillator of claim 31 wherein said laminated substrate is generally planar and has a plurality of cavities therein.

40. A method for manufacturing a crystal regulated oscillator comprising the steps of:
- providing a base layer wiring substrate having a top and a bottom surface;
- patterning electrically conductive traces on said base-layer wiring substrate
- providing a cavity-layer substrate having a plurality of openings defined therein;
- patterning electrically conductive traces including test connectors on said cavity-substrate;
- laminating together said base-layer wiring substrate and said cavity-layer substrate to form a laminated, electrically interconnected wiring substrate, said cavity-layer and said base-layer together defining a plurality of cavities at said plurality of openings;
- populating said cavities with electronic components including an integrated circuit die having a frequency adjuster subcircuit and a digital memory, said digital memory being operably linked to said test connectors;
- providing a plurality of packaged frequency control components;
- enclosing said cavities with said frequency control components to produce a plurality of crystal regulated oscillators, each frequency control component being operably linked to said frequency adjuster subcircuit;
- determining temperature compensating frequency adjustment parameters for each one of said plurality of crystal regulated oscillators;
- storing said parameters in said memory for each one of said plurality of crystal regulated oscillators; and
- singulating said plurality of crystal regulated oscillators from a balance of said laminated substrate.

41. The method according to claim 40 wherein said step of determining temperature compensating frequency adjustment parameters includes using said test connectors to communicate with each one of said plurality of crystal regulated oscillators while controllably adjusting the temperature of said laminated substrate.

42. The method according to claim 40 wherein said step of storing said parameters includes using said test connectors to write said parameters to said digital memory of each one of said plurality of crystal regulated oscillators.

* * * * *